United States Patent
Wu et al.

(10) Patent No.: US 7,541,274 B2
(45) Date of Patent: Jun. 2, 2009

(54) INTEGRATED CIRCUIT WITH A REDUCED PAD BUMP AREA AND THE MANUFACTURING METHOD THEREOF

(75) Inventors: Chan-Liang Wu, Tainan County (TW); Ming-Cheng Chiu, Tainan County (TW); Chien-Pin Chen, Tainan County (TW)

(73) Assignee: Himax Technologies Limited, Tainan County (TW)

(*) Notice: Subject to any disclaimer, the term of this patent is extended or adjusted under 35 U.S.C. 154(b) by 467 days.

(21) Appl. No.: 11/551,942

(22) Filed: Oct. 23, 2006

(65) Prior Publication Data

US 2008/0093737 A1 Apr. 24, 2008

(51) Int. Cl.
*H01L 21/44* (2006.01)
*H01L 23/52* (2006.01)
(52) U.S. Cl. ...................... 438/613; 257/758
(58) Field of Classification Search ......... 438/612–614, 438/622–625; 257/734, 758
See application file for complete search history.

(56) References Cited

U.S. PATENT DOCUMENTS

| 6,706,584 B2* | 3/2004 | List et al. ............... 438/239 |
| 7,462,558 B2* | 12/2008 | Lin et al. ............... 438/624 |
| 2007/0007662 A1* | 1/2007 | Shindo et al. ............... 257/778 |

* cited by examiner

*Primary Examiner*—Calvin Lee
(74) *Attorney, Agent, or Firm*—J.C. Patents

(57) ABSTRACT

An integrated circuit with a reduced pad bump area and the manufacturing method thereof are disclosed. The integrated circuit includes a semiconductor substrate, an interconnection layer, a passivation layer, and at least a bump. The semiconductor substrate has a semiconductor device thereon. The interconnection layer is disposed on the semiconductor substrate and topped with a top metal layer which at least includes a bonding pad and a conductive line. The passivation layer is disposed on the interconnection layer and has at least an opening to expose the bonding pad. The bump is disposed on the passivation layer to connect the bonding pad through the opening and is extended to a coverage area not directly over the bonding pad.

16 Claims, 3 Drawing Sheets

INTEGRATED CIRCUIT WITH A REDUCED PAD BUMP AREA AND THE MANUFACTURING METHOD THEREOF

BACKGROUND OF THE INVENTION

1. Field of the Invention

The present invention generally relates to an integrated circuit, in particular, to an integrated circuit with a reduced pad bump area and the manufacturing method thereof.

2. Description of Related Art

IC packages, such as TCP and COF, preceded by a bumping process have been developed for small-scale and high-density integrated circuits. For such an integrated circuit, the required die size much depends on its routing area and pad bump area.

FIG. 1 is a layout diagram illustrating the routing area and the pad bump area of an integrated circuit, and FIG. 2 is a cross-sectional view illustrating the integrated circuit along the line segment AA' in FIG. 1. Referring to FIG. 1 and FIG. 2, a semiconductor device (exemplified by two MOS transistors in FIG. 1) is disposed on a semiconductor substrate 160. An interconnection layer 170 is disposed above the semiconductor substrate 160 for interconnection of components in the semiconductor device, which may includes one or more conductive layers sandwiched in one or more dielectric layers and connected to the semiconductor device or to each other through plugs. The interconnection layer 170 is topped with a top metal layer 180. The top metal layer 180 may be used as conductive lines 120 such as signal or power lines within its routing area or bonding pads 110 within its pad bump area. A passivation layer 150 is disposed on the interconnection layer 170, which respectively has an opening 140 to expose each of the bonding pads 110. Bumps 130 are then disposed on the passivation layer 150 to connect each of the bonding pads 110 through the corresponding opening 140.

As seen in FIG. 1 and FIG. 2, the bumps 130 are disposed on the passivation layer 150 within a coverage area directly over the corresponding bonding pads 110. Therefore, to meet size limitations on the bumps 130 in certain IC packages, the pad bump area has to be enlarged. Therefore, it is desired to provide an integrated circuit and the manufacturing method thereof, which can meet the size limitations on the bumps and also reduce the pad bump area, thus reducing the required die size and the cost.

SUMMARY OF THE INVENTION

Accordingly, the present invention is directed to an integrated circuit, wherein the bump size remains unchanged, but the length of the bonding pad is shortened. Therefore, the routing area of the integrated circuit is reduced.

The present invention is directed to an integrated circuit which comprises a semiconductor substrate, an interconnection layer, a passivation layer, and at least a bump. The semiconductor substrate has a semiconductor device thereon. The interconnection layer is disposed on the semiconductor substrate and topped with a top metal layer. The top metal layer at least includes a bonding pad and a conductive line. The passivation layer is disposed on the interconnection layer and has at least an opening to expose the bonding pad. The bump is disposed on the passivation layer to connect the bonding pad through the opening, and is extended to a coverage area not directly over the bonding pad.

The integrated circuit according to an embodiment of the present invention, wherein the semiconductor substrate is a silicon substrate, and the semiconductor device comprises one or more transistors.

The integrated circuit according to an embodiment of the present invention, wherein the interconnection layer further comprises a plurality of conductive layers and a plurality of dielectric layers. The dielectric layers are sandwiched between each two of the conductive layers, so the conductive layers can connect to each other or to the semiconductor device through plugs.

The integrated circuit according to an embodiment of the present invention, wherein the bump is composed of Au, the top metal layer is composed of Al, Al—Cu—Si alloy or W, and the passivation layer is composed of silicon nitride or Phosphosilicate Glass (PSG).

The integrated circuit according to an embodiment of the present invention, wherein the opening is filled with a plug to connect the corresponding bump and bonding pad, and the plug is composed of Al or W.

The present invention is directed to a method of manufacturing an integrated circuit. In the method, a semiconductor substrate having a semiconductor device disposed thereon is provided. An interconnection layer is disposed on the semiconductor substrate, topped with a top metal layer, and at least having a bonding pad and a conductive line. A passivation layer is disposed on the interconnection layer, and having at least an opening to expose the bonding pad. At least a bump is disposed on the passivation layer to connect the bonding pad through the opening, and extending to a coverage area not directly over the bonding pad.

The method of manufacturing an integrated circuit according to an embodiment of the present invention, wherein in the step of disposing an interconnection layer, a plurality conductive layers and a plurality of dielectric layers sandwiched between each two of the conductive layers are iteratively disposed, so the conductive layers can connect to each other or to the semiconductor device through plugs.

In the present invention, the bump is extended from the bonding pad area to the conductive line area with original size. Since a passivation layer is disposed on the bonding pad area to separate the bonding pad area from the bump and other conductive lines, the bump may not only cover the bonding pad area but also cover the conductive line area. Accordingly, the bonding pad is not required to be as long as the bump and its length can be shortened. Finally, an integrated circuit with reduced the routing area is obtained.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
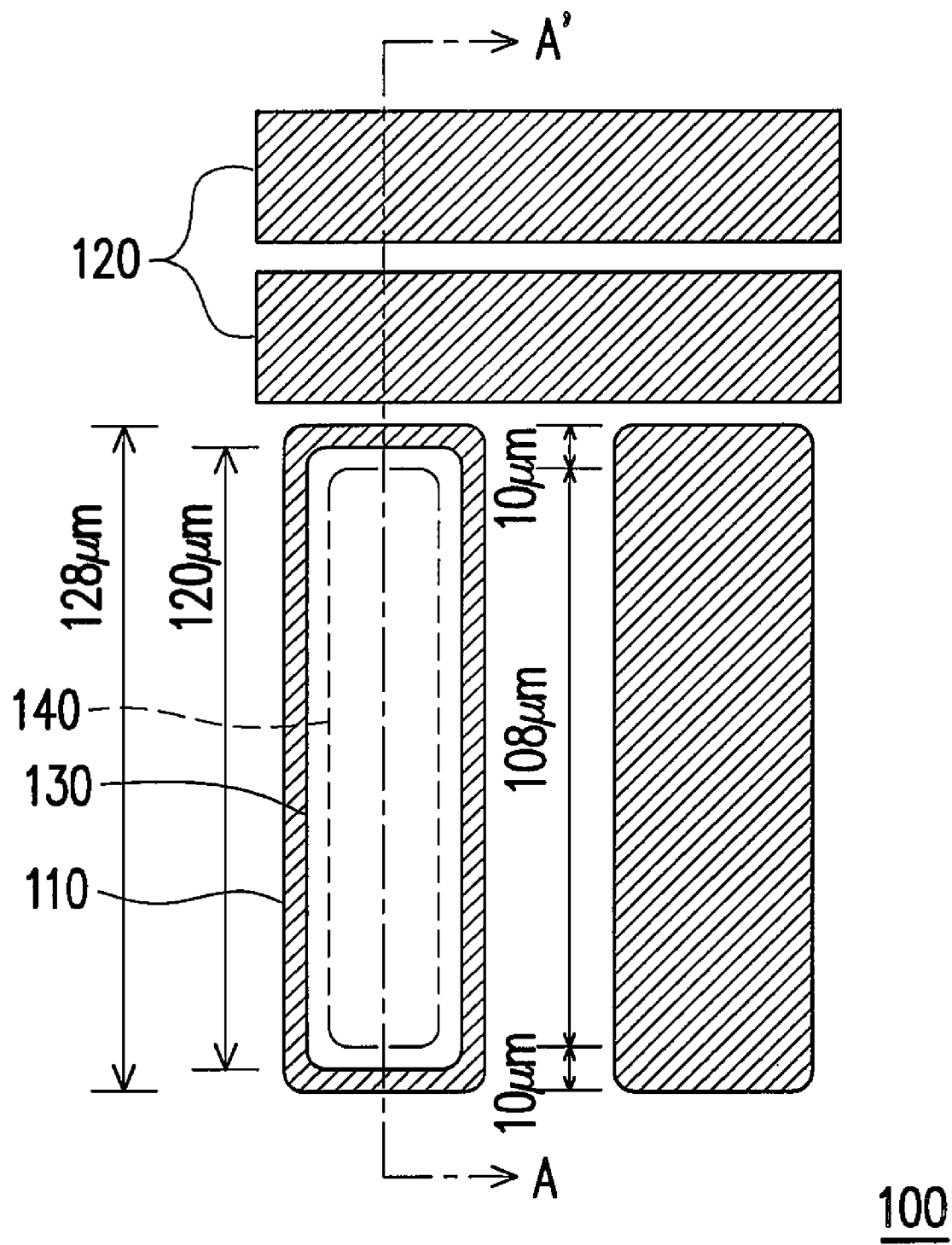
FIG. 1 is a layout diagram illustrating the routing area and the pad bump area of an integrate circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
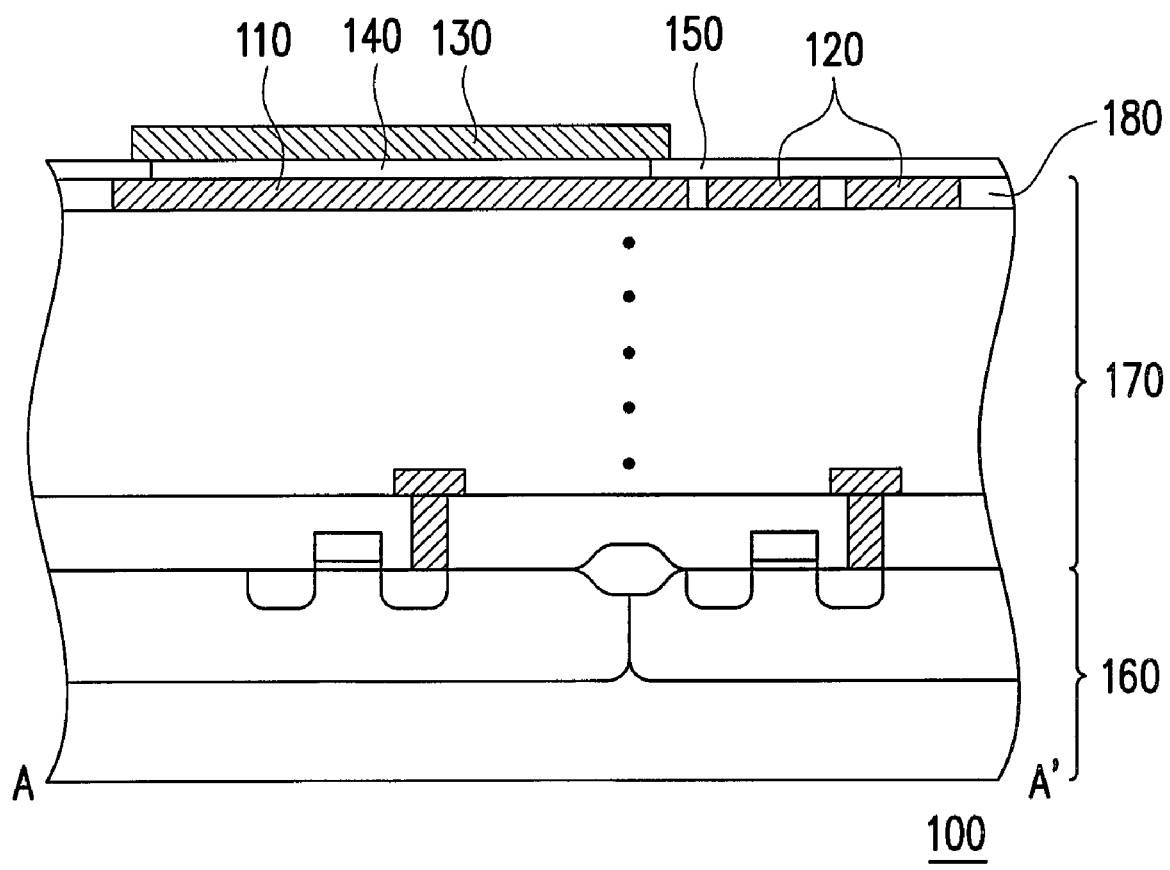
FIG. 2 is a cross-sectional view illustrating the integrated circuit along the line segment AA' in FIG. 1.

In the common integrated circuit as shown in FIG. 1 and FIG. 2, the conductive lines 120 and the bonding pads 110 are formed with the same layer, that is, the top metal layer 180. A passivation layer 150 is disposed on both the conductive lines 120 and the bonding pads 110 and respectively has an opening 140 to expose each of the bonding pads 110. Bumps 130 are then disposed on the passivation layer 150 to connect each of the bonding pads 110 through the corresponding opening 140. In the structure described above, there is nothing disposed on the passivation layer 150 within a coverage area not directly over the bonding pads 110 such as over the conductive lines 120 before additional IC packaging steps are taken. Consequently, it is possible to extend each of the bumps 130 on the passivation layer 150 to a coverage area not directly over the corresponding bonding pad 110, so as to reduce the pad bump area, thus reducing the required die size and the cost. The detail description of the present invention is as follows.

Figure 3:
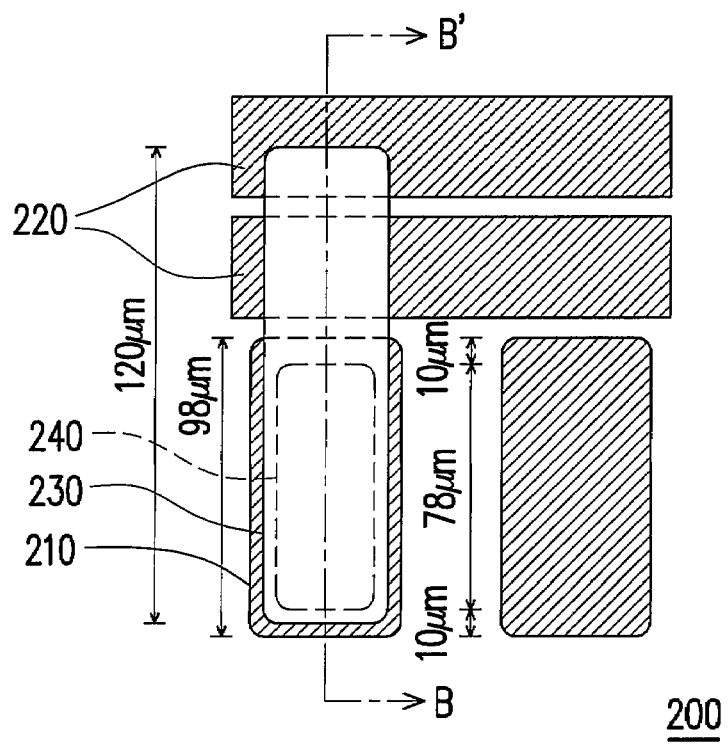
FIG. 3 is a layout diagram illustrating the routing area and the pad bump area of an integrated circuit according to an embodiment of the present invention.
Figure 4:
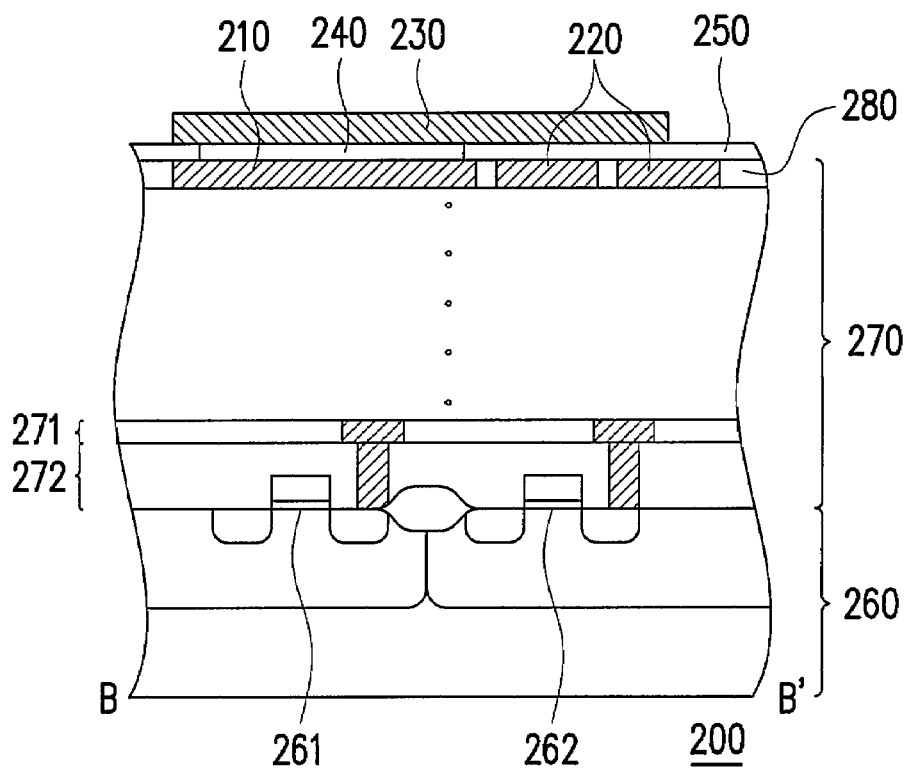
FIG. 4 is a cross-sectional view illustrating the integrated circuit along the line segment BB' in FIG. 3 according to an embodiment of the present invention.

FIG. 3 is a layout diagram illustrating the routing area and the pad bump area of an integrated circuit according to an embodiment of the present invention, and FIG. 4 is a cross-sectional view illustrating the integrated circuit along the line segment BB' in FIG. 3 according to an embodiment of present invention. Referring to FIG. 3 and FIG. 4, the integrated circuit 200 in the present embodiment includes a semiconductor substrate 260, an interconnection layer 270, a passivation layer 250, and one or more bumps 230.

The semiconductor substrate 260 may be a silicon substrate, which is provided with a semiconductor device (exemplified by two MOS transistor 261 and 262 in FIG. 3) disposed thereon. Although the semiconductor device is exemplified by two MOS transistors, it is noted that the semiconductor device of the present invention is not limited thereto, and other kinds of components are also possible for the semiconductor device.

An interconnection layer 270 is disposed on the semiconductor substrate 260. The interconnection layer 270 may comprise one or more conductive layers 271 sandwiched in one or more dielectric layers 272 and connected to the semiconductor device or to each other through plugs. The interconnection layer 270 is topped with a top metal layer 280. As seen in FIG. 3 and FIG. 4, the top metal layer 280 in the present embodiment, as that in FIG. 1 and FIG. 2, may be used as bonding pads 210 within the pad bump area or conductive lines 220 such as signal or power lines within the routing area. The bonding pads 210 and the conductive lines 220 are formed with the same layer, that is, the top metal layer 280, which can be composed of Aluminum (Al), Al—Cu—Si alloy or Wolfram (W). The interconnection layer 270 is provided for interconnection of components, such as MOS transistors 261 and 262, in the semiconductor device.

A passivation layer 250 is disposed on the interconnection layer 270, which respectively has an opening 240 to expose each of the bonding pads 210. The passivation layer 250 is provided for protection of the integrated circuit from outside impurities and is usually composed of silicon nitride or Phosphosilicate Glass (PSG).

Bumps 230, usually composed of Gold (Au), are disposed on the passivation layer 250 to connect each of the bonding pads 210 through the corresponding opening 240, wherein each of the openings 240 is filled with a plug to connect the corresponding bump 230 and bonding pad 210. The plug can be composed of Al or W.

As seen in both FIG. 3 and FIG. 4, each of the bumps 230 on the passivation layer 250 is not only disposed within a coverage area directly over the corresponding bonding pads 210, but also extends to a coverage area not directly over the corresponding bonding pads 210, such as over the conductive lines 220. Since each of the bumps 230 may extend outside the corresponding bonding pad 210, the pad bump area of the integrated circuit can be reduced, thus reducing the required die size and the cost.

In summary, according to the integrated circuit of the present invention, since each of the bumps is disposed above a coverage area directly over the corresponding bonding pad and also extends to a coverage area not directly over the corresponding bonding pad, such as over the conductive lines, the bonding pads can be shrunk to be smaller in area than the corresponding bonding pads, leading to a reduced pad bump area.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an integrated circuit, comprising:
   providing a semiconductor substrate having a semiconductor device disposed thereon;
   disposing an interconnection layer on the semiconductor substrate, the interconnection layer being topped with a top metal layer and at least having a bonding pad and a conductive line;
   disposing a passivation layer on the interconnection layer, the passivation layer having at least an opening to expose the bonding pad; and
   disposing at least a bump on the passivation layer to connect the bonding pad through the opening, the bump extending to a coverage area not directly over the bonding pad.

2. The method as recited in claim 1, wherein the semiconductor substrate is a silicon substrate, and the semiconductor device comprises one or more transistors.

3. The method as recited in claim 1, wherein the step of disposing an interconnection layer further comprises:
   iteratively disposing a plurality conductive layers and a plurality of dielectric layers sandwiched between each two of the conductive layers, so the conductive layers can connect to each other or to the semiconductor device through plugs.

4. The method as recited in claim 1, wherein the bump is composed of Au.

5. The method as recited in claim 1, wherein the top metal layer is composed of Al, Al—Cu—Si alloy or W.

6. The method as recited in claim 1, further comprising:
   filling the opening with a plug to connect the corresponding bump and bonding pad.

7. The method as recited in claim 6, wherein the plug is composed of Al or W.

8. The method as recited in claim 1, wherein the passivation layer is composed of silicon nitride or Phosphosilicate Glass (PSG).

9. An integrated circuit, comprising:
a semiconductor substrate having a semiconductor device thereon;
an interconnection layer, disposed on the semiconductor substrate and topped with a top metal layer, the top metal layer at least including a bonding pad and a conductive line;
a passivation layer, disposed on the interconnection layer, having at least an opening to expose the bonding pad; and
at least a bump, disposed on the passivation layer to connect the bonding pad through the opening, the bump extending to a coverage area not directly over the bonding pad.

10. The integrated circuit as recited in claim 9, wherein the semiconductor substrate is a silicon substrate, and the semiconductor device comprises one or more transistors.

11. The integrated circuit as recited in claim 9, wherein the interconnection layer further comprises:
a plurality of conductive layers; and
a plurality of dielectric layers sandwiched between each two of the conductive layers, so the conductive layers can connect to each other or to the semiconductor device through plugs.

12. The integrated circuit as recited in claim 9, wherein the bump is composed of Au.

13. The integrated circuit as recited in claim 9, wherein the top metal layer is composed of Al, Al—Cu—Si alloy or W.

14. The integrated circuit as recited in claim 9, wherein the opening is filled with a plug to connect the corresponding bump and bonding pad.

15. The integrated circuit as recited in claim 14, wherein the plug is composed of Al or W.

16. The integrated circuit as recited in claim 9, wherein the passivation layer is composed of silicon nitride or Phosphosilicate Glass (PSG).

\* \* \* \* \*